US010084089B2

(12) United States Patent
Li et al.

(10) Patent No.: US 10,084,089 B2
(45) Date of Patent: *Sep. 25, 2018

(54) SOURCE AND DRAIN STRESSORS WITH RECESSED TOP SURFACES

(71) Applicant: Taiwan Semiconductor Manufacturing Company, Ltd., Hsinchu (TW)

(72) Inventors: Kun-Mu Li, Zhudong Township (TW); Tsz-Mei Kwok, Hsinchu (TW); Hsueh-Chang Sung, Zhubei (TW); Chii-Horng Li, Zhubei (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/695,813

(22) Filed: Sep. 5, 2017

(65) Prior Publication Data

US 2018/0012997 A1 Jan. 11, 2018

Related U.S. Application Data

(60) Continuation of application No. 15/443,954, filed on Feb. 27, 2017, now Pat. No. 9,755,077, which is a
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/823412* (2013.01); *H01L 21/823418* (2013.01); *H01L 21/823425* (2013.01); *H01L 27/088* (2013.01); *H01L 29/0847* (2013.01); *H01L 29/165* (2013.01);
(Continued)

(58) Field of Classification Search
CPC ..... H01L 21/823412; H01L 21/823425; H01L 27/088; H01L 29/0847; H01L 29/66636; H01L 29/7834; H01L 29/7878; H01L 21/02532; H01L 21/0262; H01L 21/02636
See application file for complete search history.

(56) References Cited

U.S. PATENT DOCUMENTS 9,583,483 B2* 2/2017 Li ................... H01L 27/088
2005/0130454 A1 6/2005 Murthy et al.
(Continued)

FOREIGN PATENT DOCUMENTS

KR 100810776 B1 2/2008
KR 1020090107798 A 10/2009
(Continued)

*Primary Examiner* — Thanh T Nguyen
(74) *Attorney, Agent, or Firm* — Slater Matsil, LLP (57) ABSTRACT

An integrated circuit structure includes a gate stack over a semiconductor substrate, and a silicon germanium region extending into the semiconductor substrate and adjacent to the gate stack. The silicon germanium region has a top surface, with a center portion of the top surface recessed from edge portions of the top surface to form a recess. The edge portions are on opposite sides of the center portion.

20 Claims, 11 Drawing Sheets

Related U.S. Application Data division of application No. 14/017,062, filed on Sep. 3, 2013, now Pat. No. 9,583,483.

(51) Int. Cl.
- *H01L 27/088* (2006.01)
- *H01L 29/66* (2006.01)
- *H01L 21/8234* (2006.01)
- *H01L 29/165* (2006.01)
- *H01L 29/08* (2006.01)

(52) U.S. Cl.
CPC ...... *H01L 29/665* (2013.01); *H01L 29/66636* (2013.01); *H01L 29/7834* (2013.01); *H01L 21/0262* (2013.01); *H01L 21/02636* (2013.01)

(56) References Cited

U.S. PATENT DOCUMENTS

| | | |
|---|---|---|
| 2008/0246057 A1 | 10/2008 | Lin et al. |
| 2009/0258463 A1 | 10/2009 | Kim et al. |
| 2011/0287611 A1 | 11/2011 | Cheng et al. |
| 2012/0104514 A1 | 5/2012 | Park et al. |
| 2012/0223364 A1 | 9/2012 | Chung et al. |
| 2013/0001555 A1 | 1/2013 | Yin et al. |
| 2013/0001591 A1 | 1/2013 | Wu et al. |
| 2013/0071981 A1 | 3/2013 | Huang et al. |
| 2013/0137243 A1 | 5/2013 | Yang et al. |
| 2013/0161751 A1 | 6/2013 | Chung et al. |
| 2013/0270611 A1 | 10/2013 | Adam et al. |
| 2013/0295739 A1 | 11/2013 | Hsiao et al. |
| 2014/0127886 A1* | 5/2014 | Sung ................ H01L 29/66636 438/478 |
| 2014/0134818 A1* | 5/2014 | Cheng ............... H01L 29/66636 438/300 |
| 2015/0048417 A1 | 2/2015 | Kwok et al. |
| 2015/0061024 A1 | 3/2015 | Li |

FOREIGN PATENT DOCUMENTS

| | | |
|---|---|---|
| KR | 1020120099863 A | 9/2012 |
| KR | 1020130007412 A | 1/2013 |

* cited by examiner

SOURCE AND DRAIN STRESSORS WITH RECESSED TOP SURFACES

CROSS-REFERENCE TO RELATED APPLICATIONS

This application is a continuation of application Ser. No. 15/443,954, filed Feb. 27, 2017 which is a divisional of application Ser. No. 14/017,062, filed Sep. 3, 2013, which application is hereby incorporated herein by reference.

BACKGROUND

Metal-Oxide Semiconductor (MOS) devices are key components of integrated circuits. The performance of MOS devices affects the performance of the entire integrated circuits in which the MOS devices are located. Therefore, methods for improving the performance of the MOS devices have been studied.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 9 are cross-sectional views and top views of intermediate stages in the manufacturing of Metal-Oxide Semiconductor (MOS) devices in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Reduction in the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in the current flow between the source and drain when a sufficient voltage is applied to the gate of the MOS device.

To further enhance the performance of MOS devices, stress may be introduced into the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

An available method for applying compressive stresses to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along the gate spacers, epitaxially growing SiGe stressors in the recesses, and annealing. Since SiGe has a lattice constant greater than that of silicon, it expands after annealing and applies a compressive stress to the channel region, which is located between a source SiGe stressor and a drain SiGe stressor.

A process for forming Metal-Oxide-Semiconductor (MOS) devices with stressors is provided in accordance with various exemplary embodiments. The intermediate stages of forming the MOS devices are illustrated. The variations of the embodiments are discussed. Throughout the various views and illustrative embodiments, like reference numbers are used to designate like elements.

Figure 1A:
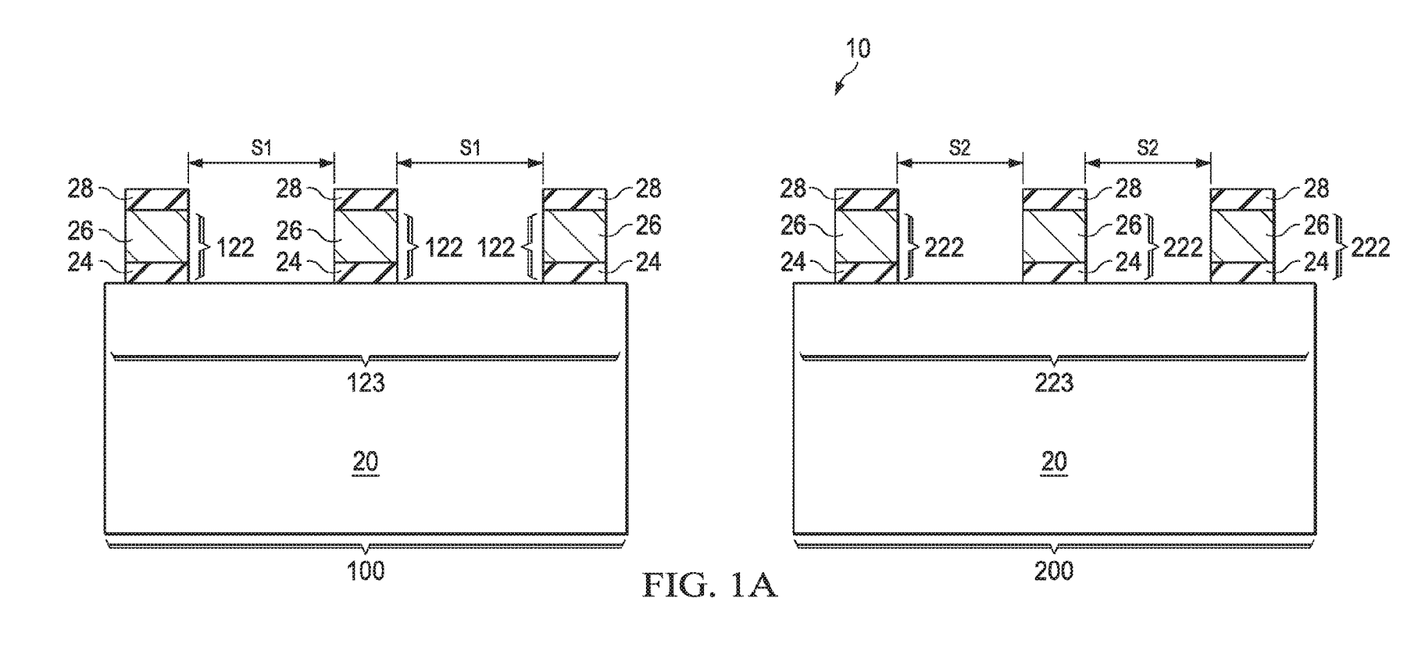

FIG. 1A illustrates substrate 20, which is a portion of wafer 10. Substrate 20 comprises a first portion in device region 100 and a second portion in device region 200. Substrate 20 may be a bulk semiconductor substrate such as a silicon substrate, or may have a composite structure, such as a Silicon-On-Insulator (SOI) structure. The material of substrate 20 may include silicon, silicon carbon, or the like. Gate stacks 122, which are parallel to each other, are formed in region 100 and over substrate 20. Gate stacks 222, which are parallel to each other, are formed in device region 200 and over substrate 20. In some embodiments, neighboring gate stacks 122 are spaced apart from each other by uniform distances S1, and neighboring gate stacks 222 are spaced apart from each other by uniform distances S2, although distances between neighboring gate stacks 122 (or 222) may also be non-uniform. Each of gate stacks 122 and 222 includes gate dielectric 24 and gate electrode 26. Gate dielectrics 24 may comprise silicon oxide or a high-k material having a high k value, for example, higher than about 7. Gate electrodes 26 may include doped polysilicon, a metal or a metal alloy, a metal silicide, or the like. Hard masks 28 may be formed over gate stacks 122 and 222, wherein hard masks 28 may comprise silicon nitride, for example.

Figure 1B:
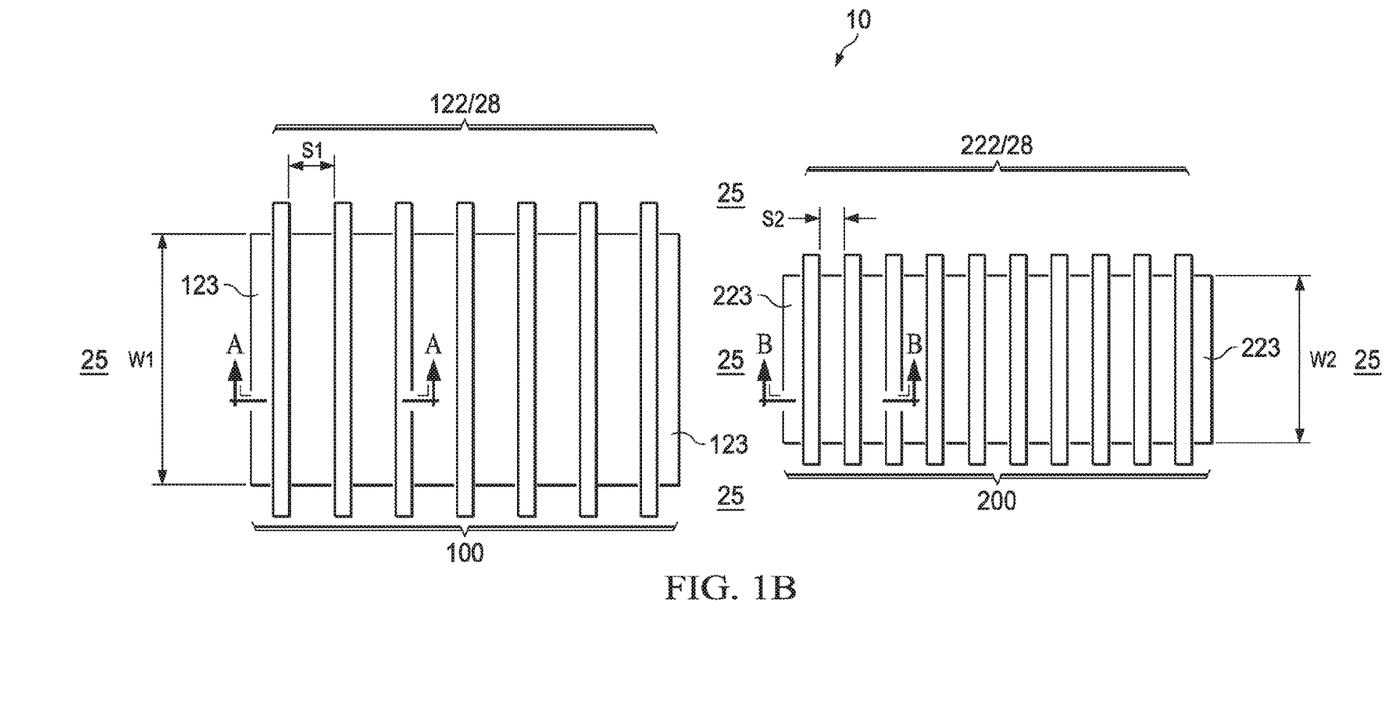

FIG. 1B illustrates a top view of the structure in FIG. 1A, wherein the cross-sectional view of device region 100 in FIG. 1A is obtained from the plane containing line A-A in FIG. 1B, and the cross-sectional view of device region 200 in FIG. 1A is obtained from the plane containing line B-B in FIG. 1B. Device regions 100 and 200 have different pattern densities and/or different sizes of gate stacks. For example, distance S1 between neighboring gate stacks 122 in region 100 may be greater than distance S2, which is the distance between neighboring gate stacks 222 in region 200. In some embodiments, distance S1 is greater than 100 nm, and width W2 is smaller than 100 nm. Ratio S1/S2 may be greater than about 2, for example.

Also, active region 123 and 223 in device regions 100 and 200, respectively, are defined by Shallow Trench Isolation (STI) regions 25. Gate stacks 122 cross active region 123, and gate stacks 222 cross active region 223. In some embodiments, active region 123 has width W1, which is greater than width W2 of active region 223. In some exemplary embodiments, width W1 is greater than 300 nm, and width W2 is smaller than 300 nm. Furthermore, ratio W1/W2 may be greater than about 2, for example.

Figure 2:
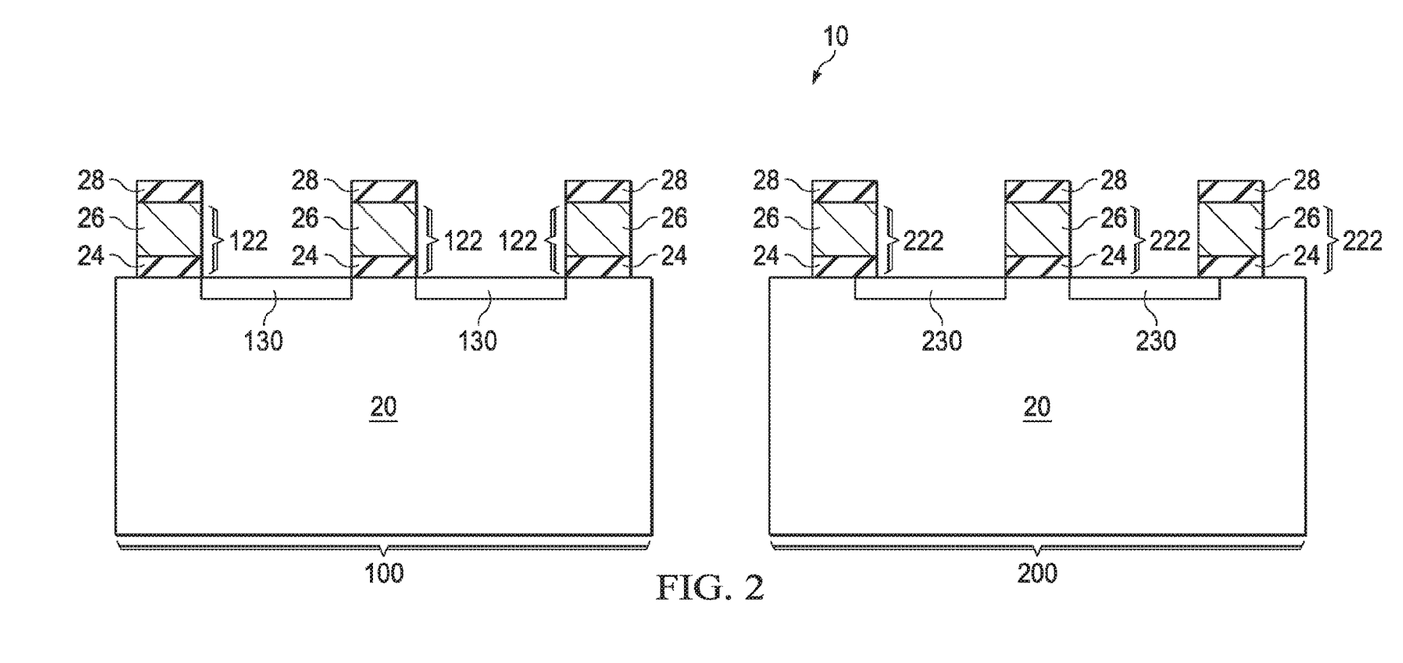

Referring to FIG. 2, Lightly Doped Drain/source (LDD) regions 130 and 230 are formed, for example, by implanting a p-type impurity into substrate 20. Gate stacks 122 and 222 and the overlying hard mask 28 act as implantation masks, so that the inner edges of LDD regions 130 and 230 are substantially aligned to the edges of gate stacks 122 and 222, respectively. The LDD implantation may be performed using energies in a range between about 1 keV and about 10 keV, and a dosage in a range between about $1 \times 10^{13}/cm^2$ and about $1 \times 10^{16}/cm^2$. It is appreciated, however, that the values recited throughout the description are merely examples, and may be changed to different values. The LDD implantation may be performed with a tilt angle, with the tilt angle smaller than about 30 degrees, for example. Alternatively, the LDD implantation is performed vertically. In addition, pocket regions (not shown) may be formed, for example, by implanting an n-type impurity such as arsenic, phosphorous, or the like into substrate 20. The pocket implantation may be performed using energies in a range between about 20 keV and about 80 keV, and a dosage in a range between about $1 \times 10^{12}/cm^2$ and about $1 \times 10^{14}/cm^2$. The pocket implantation may be tilted. In some embodiments, the tilt angle of the pocket implantation is in a range between about 15 degree and about 45 degrees.

Figure 3:
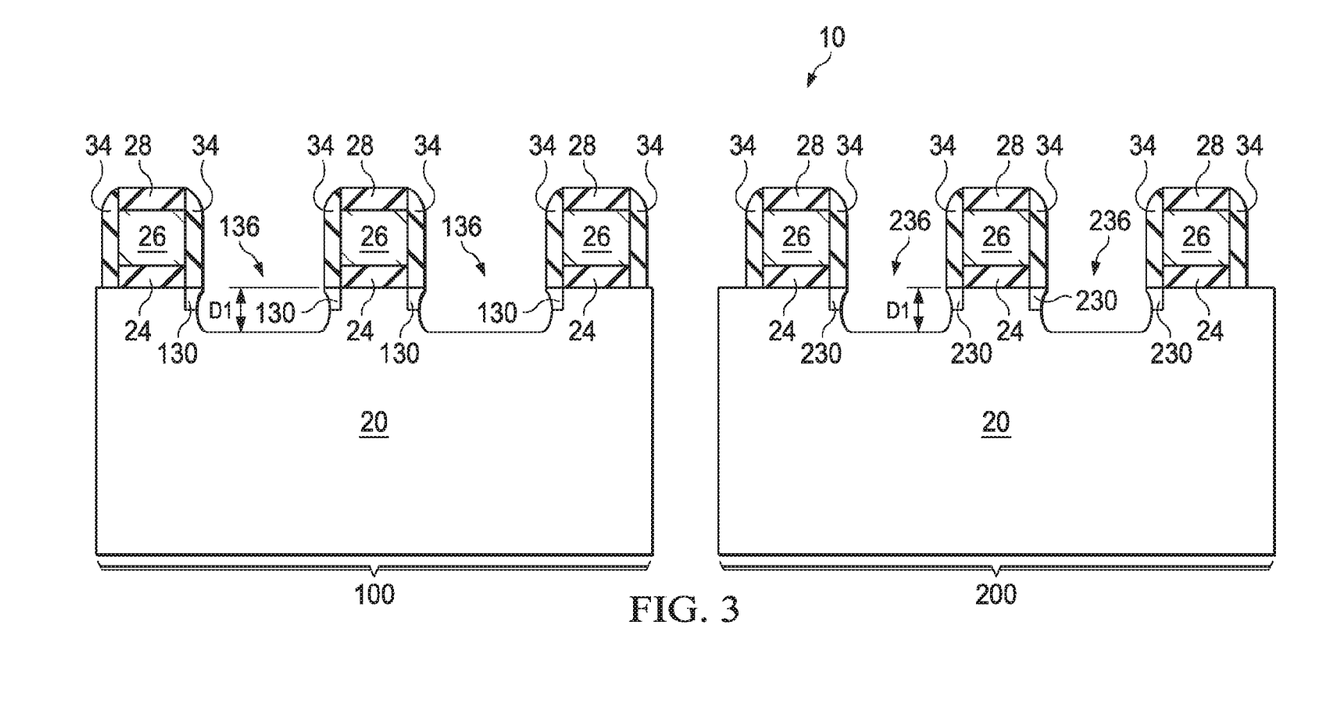

Referring to FIG. 3, gate spacers 34 are formed on the sidewalls of gate stacks 122 and 222. In some embodiments, each of gate spacers 34 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

As also shown in FIG. 3, an isotropic etch is performed to form openings 136 and 236 in device regions 100 and 200, respectively. The isotropic etch may be a dry etch, wherein the etching gas may be selected from $CF_4$, $Cl_2$, $NF_3$, $SF_6$, and combinations thereof. Depth D1 of opening 136 and opening 236 may be in a range between about 150 Å and about 500 Å, for example.

Figure 4:
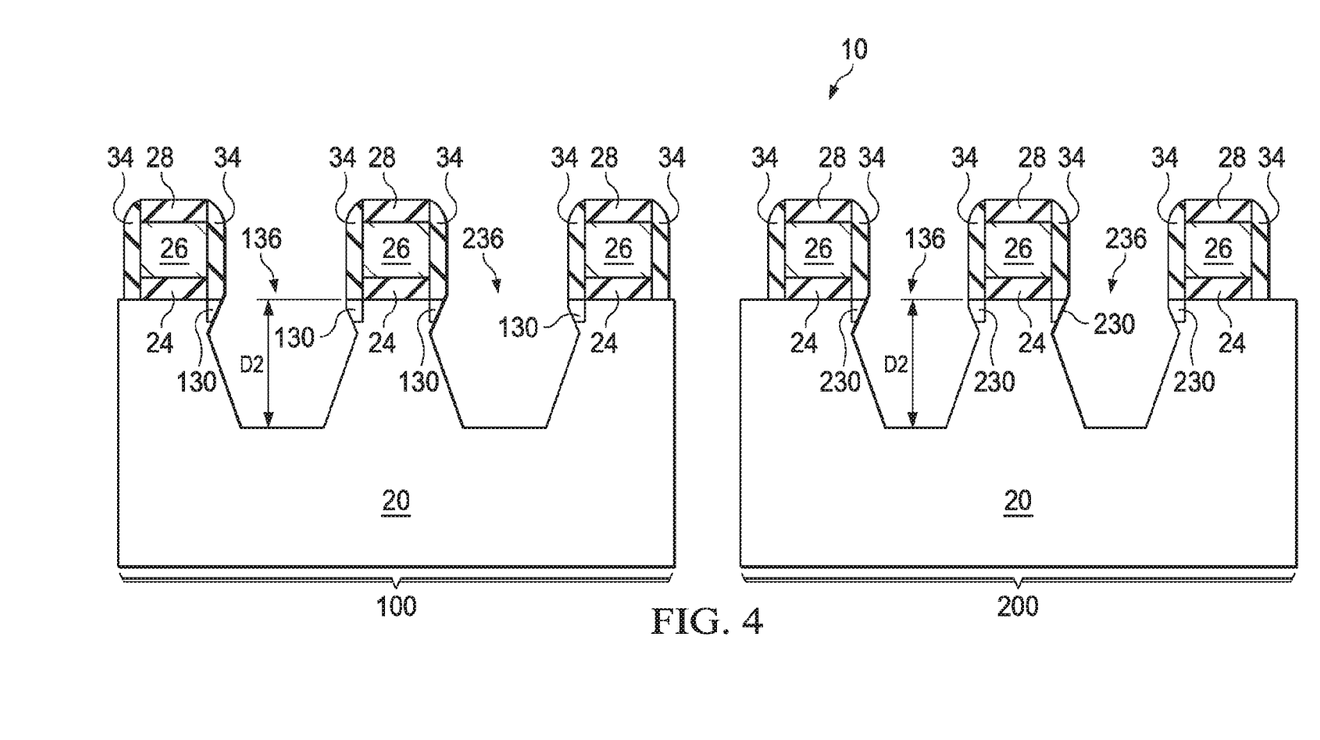

Next, as shown in FIG. 4, a wet etch may be performed to expand openings 136 and 236. The wet etching may be performed, for example, using Tetra-Methyl Ammonium Hydroxide (TMAH), a potassium hydroxide (KOH) solution, or the like. In some exemplary embodiments, the TMAH solution has a concentration in a range between about one percent and about 30 percent. During the wet etch, the temperature of the TMAH may be in a range between about 20° C. and about 100° C. After the wet etching, facets are formed in openings 136 and 236, which facets may include (111) planes of substrate 20. In some exemplary embodiments, after the wet etching, depth D2 of opening 136 and opening 236 may be in may be in a range between about 20 nm and about 60 nm, for example.

After the wet etch, a pre-clean may be performed, for example, using an HF-based gas or a SiCoNi-based gas. The pre-clean may remove the silicon oxide that is formed as a result of the nature oxidation of the exposed surfaces in openings 136 and 236. A high-temperature baking may also be performed, although the baking may also be skipped. The high-temperature baking may be performed with or without the presence of HCl gas. The baking temperature may be between about 700° C. and about 900° C. The pressure of the baking gases may be in a range between about 10 Torr and about 200 Torr. The baking duration may be in a range between about 30 seconds and about 240 seconds, for example. The high-temperature baking may also remove the native oxide on the exposed surfaces of substrate 20, which exposed surfaces are in openings 136 and 236.

Figure 5A:
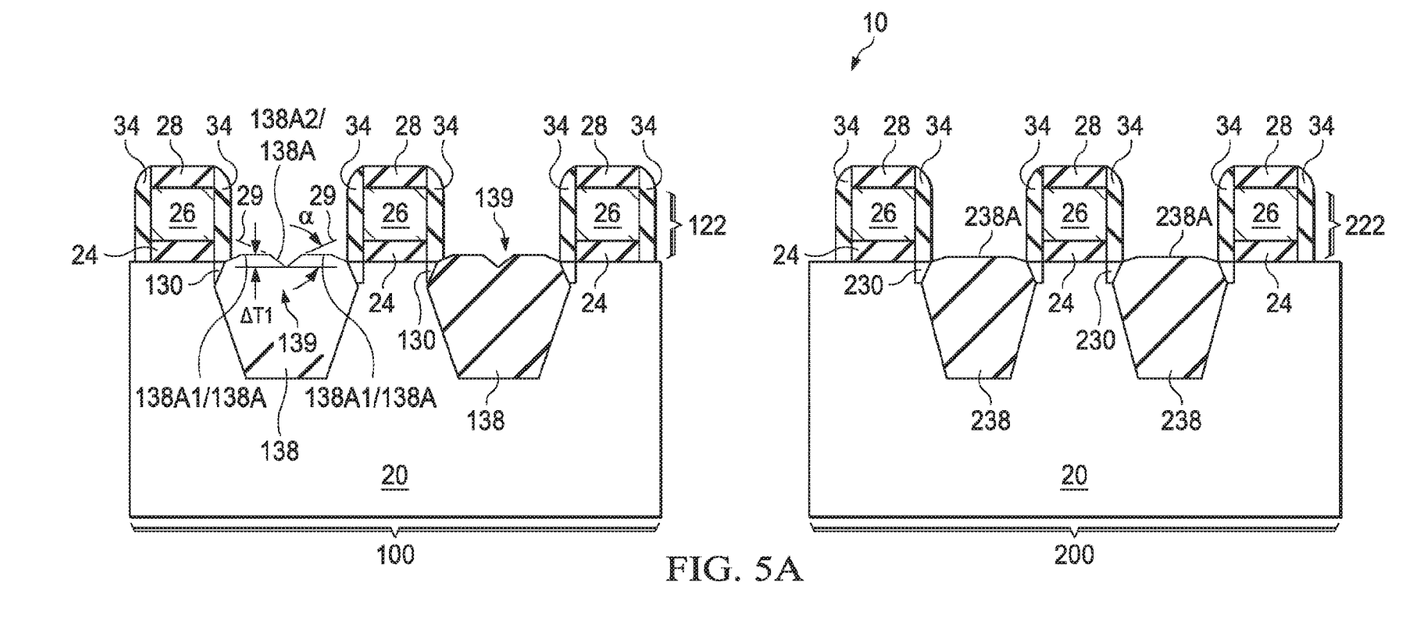

As shown in FIG. 5A, a semiconductor material, such as silicon germanium (SiGe), is epitaxially grown in openings 136 and 236 through Selective Epitaxial Growth (SEG), forming epitaxy regions 138 and 238 in recesses 136 and 236 (FIG. 4), respectively. Epitaxy regions 138 and 238 act as the source and drain regions and the source/drain stressors for the respective MOS devices. Throughout the description, epitaxy regions 138 and 238 are also referred to as SiGe regions. Top surface 138A of epitaxy region 138 may be higher than the interface between gate stack 122 and the respective underlying top surface of semiconductor substrate 20, and top surface 238A of epitaxy region 238 may be higher than the interface between gate stack 222 and the respective underlying top surface of semiconductor substrate 20. The process gases for the epitaxy may include $H_2$, $N_2$, Dichloro-Silane (DCS), $SiH_4$, $GeH_4$, and/or the like. The temperature of the epitaxy may be in a range between about 600° C. and about 900° C. The pressure of the process gases may be in a range between about 10 Torr and about 200 Torr. In some embodiments, an etching gas such as HCl may also be added to promote the selective growth on the exposed surfaces of substrate 20, but not on dielectrics such as gate spacers 34. The epitaxy is performed until recesses 136 and 236 (FIG. 4) are fully filled. During the epitaxy, desired impurities may be doped while the growth proceeds. For example, when boron is to be doped, $B_2H_6$ may be included in the process gases. Epitaxy regions 138 and 238 may have a germanium percentage in a range between about 15 percent and about 60 percent, for example, although different germanium percentages may also be used.

Due to different distances S1/S2 (FIG. 1B) and/or different widths W1/W2, the top surface profile of epitaxy regions 138 may be different from the top surface profile of epitaxy regions 238. In some embodiments, the top surface 138A of epitaxy region 138 has two edge portions 138A1 that are substantially flat. Top surface 138A of epitaxy region 138 also includes center portion 138A2, which is between two portions 138A1, wherein portion 138A2 is recessed to be lower than portions 138A1, forming recesses 139. In some embodiments, portion 138A2 include two substantially straight (planar) portions tilting to opposite directions, wherein the substantially straight portions form straight lines 29 in the cross-sectional view in FIG. 5A. Portion 138A2 form angle α with a horizontal plane that is parallel to the (major) top surface of substrate 20. In some embodiments, angle α is in a range between about 5 degrees and about 45 degrees. The lowest point of top surface portion 138A2 is lower than top surface portions 138A1 by height difference ΔT1, which may be in a range between about 1 nm and about 10 nm. Difference ΔT1 may also be the height difference between the lowest point of center portion 138A2 and the highest points of top surface 138A.

Figure 5B:
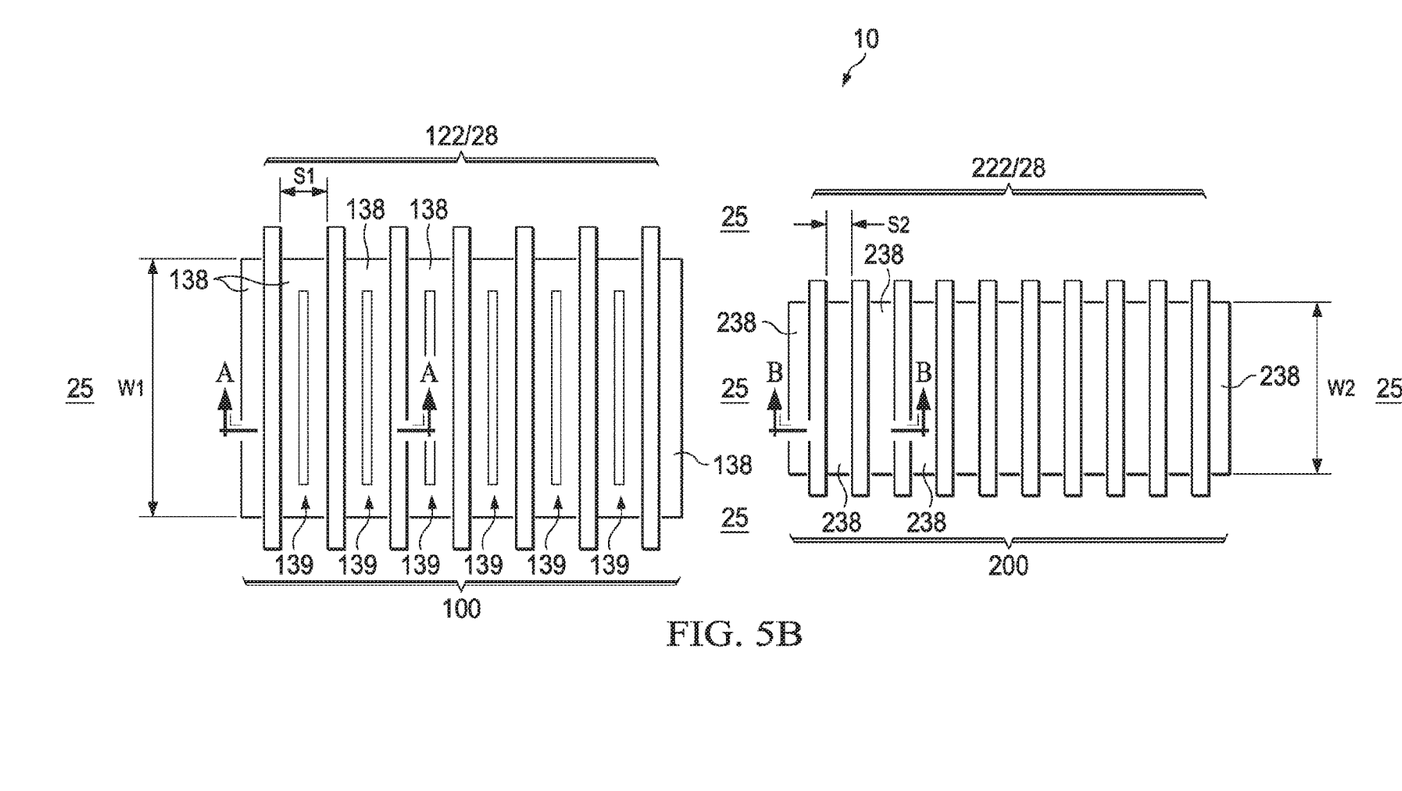

Although FIG. 5A illustrates that the bottom portion of center portion 138A2 is the joint of two straight lines 29, in alternative embodiments, the lowest portion of top surface portion 138A2 is a substantially flat surface. The recess 139, which is formed by recessed top surface portions 138A2 has a lengthwise direction parallel to the lengthwise directions of gate stacks 122, which recess 139 is schematically illustrated in FIG. 5B, which is a top view of the structure in FIG. 5A.

Top surfaces 238A of epitaxy regions 238 do not include recesses at the centers, and the center portions may be substantially flat. The difference in the top surface profile of epitaxy regions 138 and the top surface profile of epitaxy regions 238 may be generated and enlarged by adjusting the process conditions for the epitaxy. For example, increasing the flow rate of HCl may result in the generation and the increase in height difference ΔT1 (FIG. 5A). In some exemplary embodiments, the flow rate of HCl is in a range between about 50 sccm and about 250 sccm. The flow rate of DCS may be in a range between about 50 sccm and about 350 sccm, and the flow rate of $GeH_4$ may be in a range between about 100 sccm and about 950 sccm. It is realized, however, that the top surface profiles of epitaxy regions 138 and 238 are also affected by the sizes (such as S1, S2, W1, and W2 in FIG. 1B), the pattern densities of the patterns, and other factors. Accordingly, the optimum process conditions for generating and the desirable top surface profiles of epitaxy regions 138 and 238 may be found through experiments.

Figure 6:
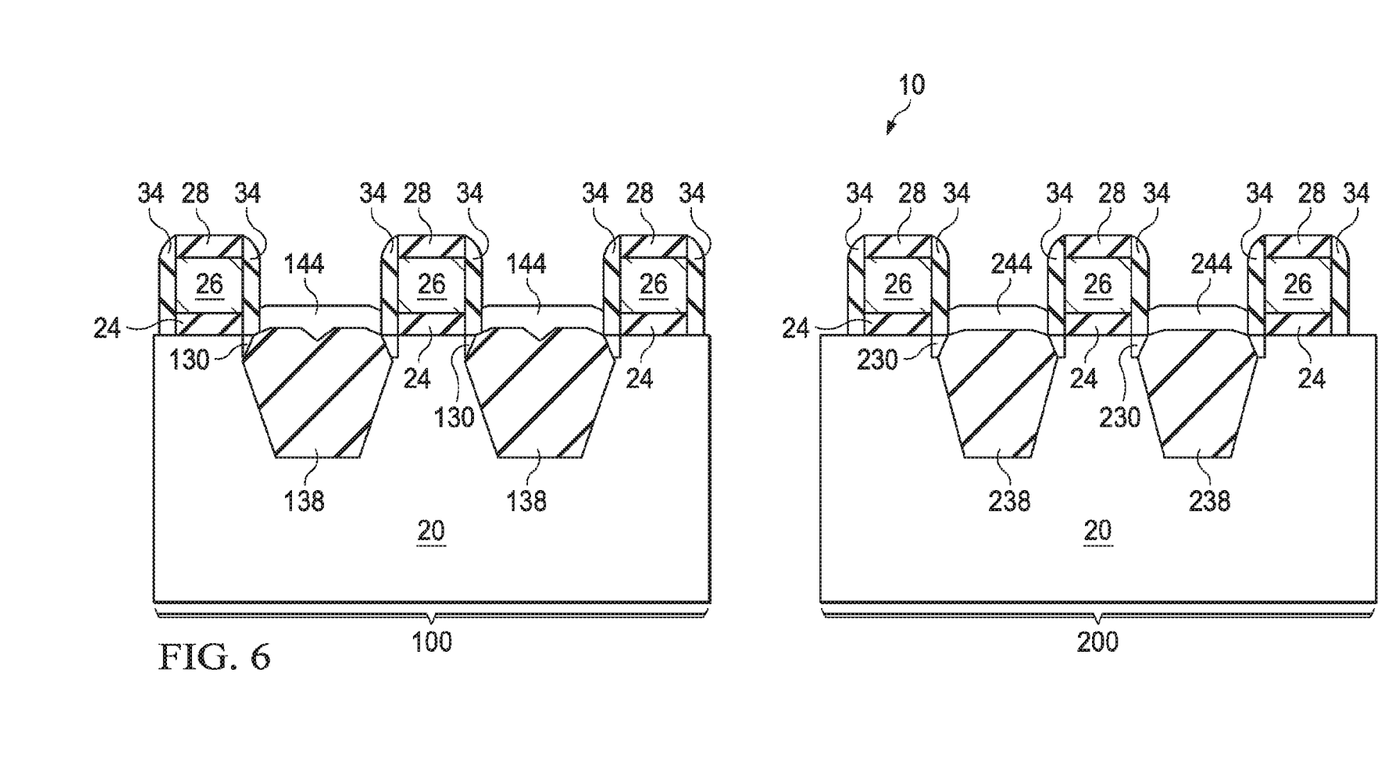

After the formation of SiGe regions 38, capping layers 144 and 244 are formed over epitaxy regions 138 and 238, respectively, through epitaxy, as shown in FIG. 6. Capping layers 144 and 244 have a low germanium percentage that is lower than the germanium percentage of epitaxy regions 138 and 238. In some embodiments, the germanium percentage of capping layers 144 and 244 is smaller than about 15 percent. Capping layers 144 and 244 may be pure silicon layers with no germanium comprised therein, or substantially pure silicon layers with, for example, less than 2 percent, or 1 percent, germanium. Accordingly, capping layers 144 and 244 are alternatively referred to as silicon caps throughout the description. Capping layers 144 and 244 may be in-situ doped with p-type impurities with the proceeding of the epitaxy, or not in-situ doped. In the embodiments that no p-type impurity or substantially no p-type impurity is doped during the epitaxy of SiGe layers 138, 238, and capping layers 144 and 244, a p-type impurity implantation may be performed to form source and drain regions for the respective MOS device.

Figure 7:
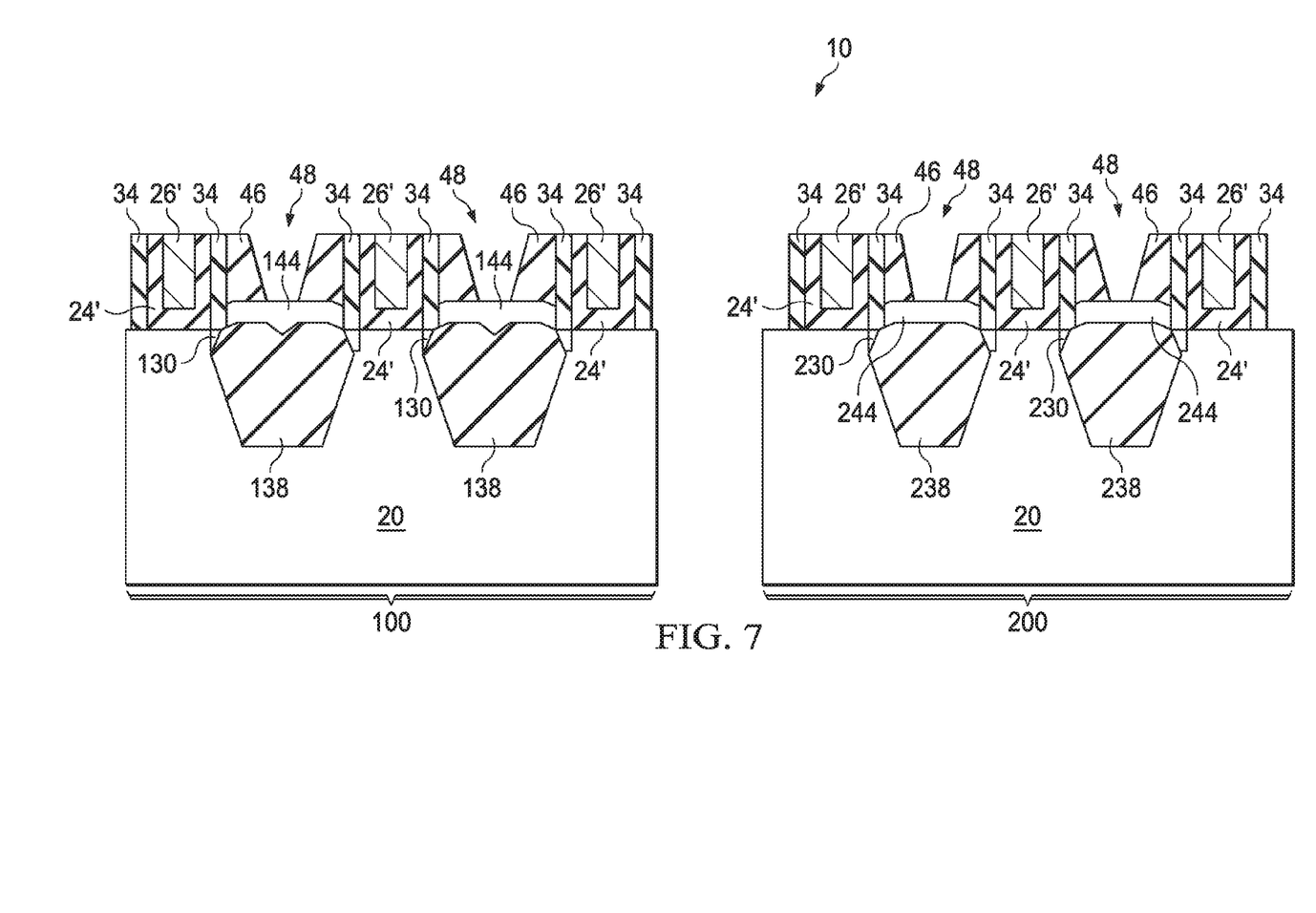

Next, referring to FIG. 7, hard masks 28 (refer to FIG. 6), if any, are removed, and replacement gates are formed to replace gate dielectrics 24 and gate electrodes 26 (FIG. 6) in accordance with some embodiments. In alternative embodiments, gate dielectrics 24 and gate electrodes 26 are not replaced with replacement gates. In the embodiments replacement gates are formed, gate dielectrics 24 and gate electrodes 26 (FIG. 6) act as dummy gates that are removed. FIG. 7 illustrates an exemplary structure including the replacement gates. The formation process may include forming Inter-Layer Dielectric (ILD) 46, performing a CMP to level the top surfaces of ILD 46 with the top surface of gate electrodes 26 (or hard mask 28, if any), and removing the dummy gates. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 24' and gate electrodes 26'. Gate dielectrics 24' may comprise a high-k dielectric material with a k value greater than about 7.0, for example, and gate electrodes 26' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. Next, contact openings 48 are formed, exposing underlying capping layers 144 and 244.

Figure 8:
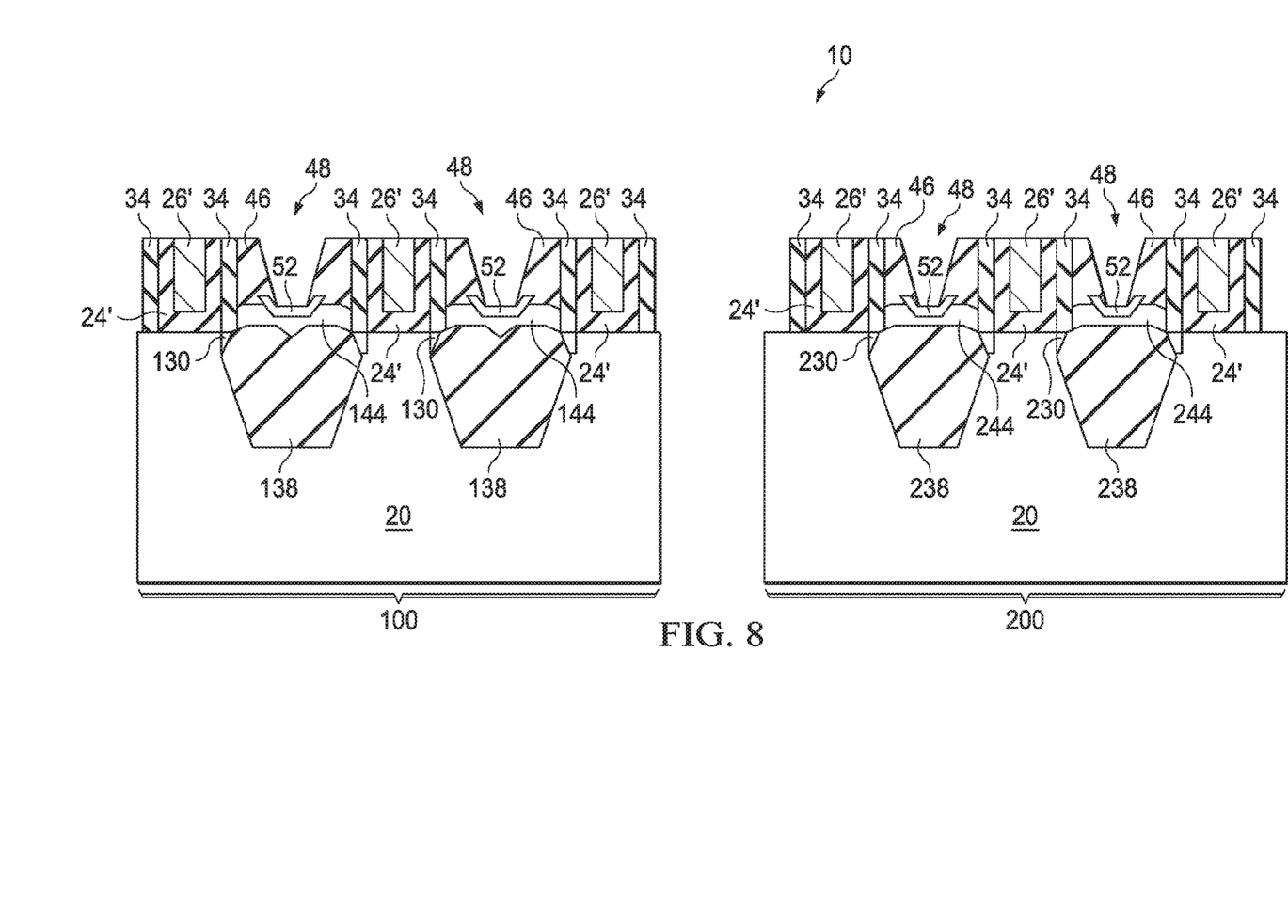

FIG. 8 illustrates the formation of source/drain silicide regions 52. Silicide regions 52 may be formed by depositing a thin layer (not shown) of a metal (referred to as silicide metal sometimes), such as titanium, cobalt, nickel, tungsten, or the like. The metal is over the devices, including the exposed surfaces of capping layers 144 and 244. An anneal is then performed to react the metal with silicon/germanium. After the reaction, a layer of metal silicide is formed between silicon and the metal. The un-reacted metal is selectively removed through the use of an etchant that attacks the metal but does not attack silicide. As a result of the silicidation, source/drain silicide regions 52 extend into capping layers 144 and 244, and may extend into SiGe regions 138 and/or 238. Alternatively, the top portions of capping layers 144 and 244 are silicided, and the bottom portions of capping layers 144 and 244 are not silicided. After the silicidation, there may be some remaining portions of capping layers 144 and 244 remaining not silicided, wherein the remaining portions of capping layers 144 and 244 are level with, and are on the opposite sides of, source/drain silicide regions 52.

Figure 9:
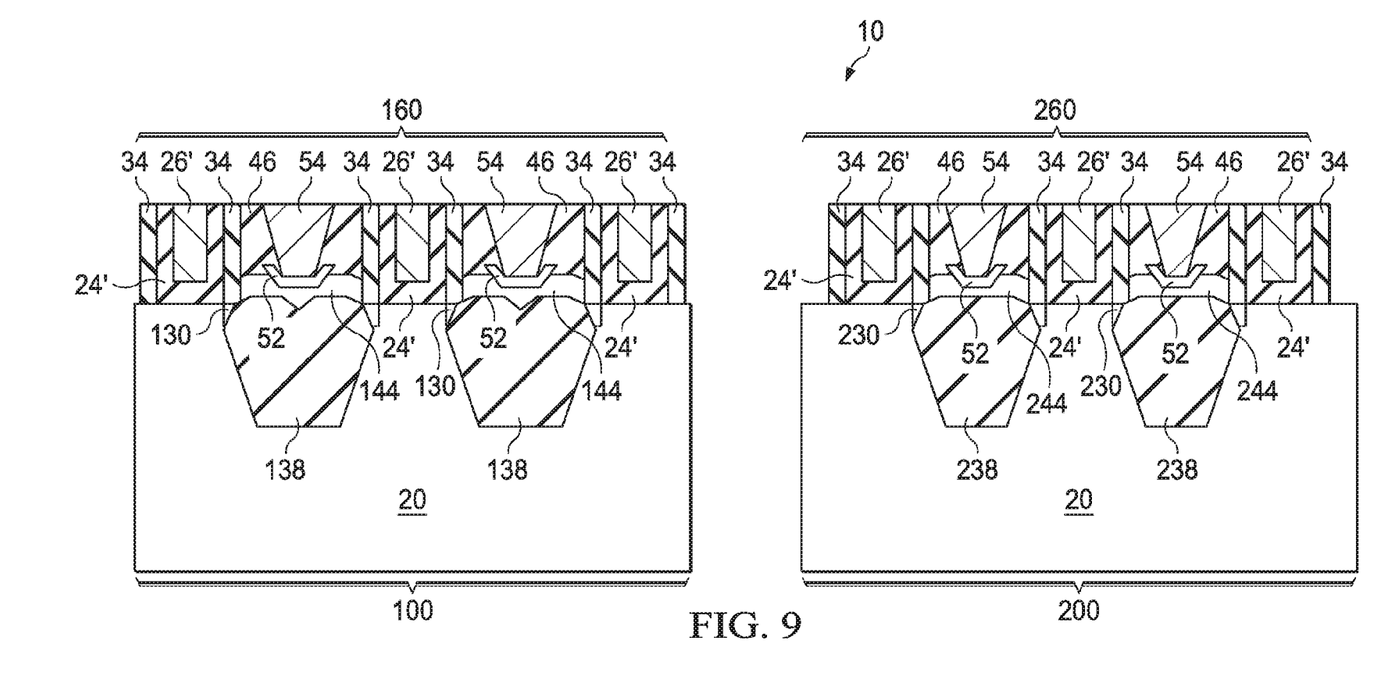

FIG. 9 illustrates the formation of source/drain contact plugs 54, which are formed by filling a conductive material such as tungsten, copper, aluminum, titanium, cobalt, silicon, and/or the like, into openings 48, and performing a CMP to level the top surface of contact plugs 54 with the top surface of ILD 46. The formation of MOS transistors 160 and 260 in device regions 100 and 200 are thus finished.

The embodiments of the present disclosure have some advantageous features. Generally, large epitaxy regions (stressors) apply smaller stresses to the nearby channel regions of MOS device than small epitaxy regions since the small epitaxy regions and channels are closely located. On the other hand, the stresses applied by the large epitaxy regions cannot be increased by growing more SiGe since SiGe has significant facets, and hence excess SiGe formation will result in the landing area of contact plugs to be reduced undesirably. In the embodiments of the present disclosure, by forming recessed (dished) top surface profile for large epitaxy regions, the facets of the SiGe stressors are reduced, and hence more SiGe germanium may be grown to apply greater stresses to the respective channel regions. The device performance such as the on-currents of the respective MOS devices is improved.

In accordance with some embodiments, an integrated circuit structure includes a gate stack over a semiconductor substrate, and a silicon germanium region extending into the semiconductor substrate and adjacent to the gate stack. The silicon germanium region has a top surface, with a center portion of the top surface recessed from edge portions of the top surface to form a recess. The edge portions are on opposite sides of the center portion.

In accordance with other embodiments, an integrated circuit structure includes a semiconductor substrate, and a first and a second MOS transistor. The first MOS transistor includes a first gate stack over the semiconductor substrate, and a first silicon germanium region extending into the semiconductor substrate and adjacent to the first gate stack. The first silicon germanium region has a first top surface, with a center portion of the first top surface recessed from edge portions of the first top surface to form a recess. The edge portions are on opposite sides of the center portion. The second MOS transistor includes a second gate stack over the semiconductor substrate, and a second silicon germanium region extending into the semiconductor substrate and adjacent to the second gate stack. The second silicon germanium region has a second top surface, wherein the second top surface does not have recessed center portions.

In accordance with yet other embodiments, a method includes forming a gate stack over a semiconductor substrate, forming an opening extending into the semiconductor substrate, wherein the opening is on a side of, and adjacent to, the gate stack. An epitaxy is performed to grow a silicon germanium region in the opening, wherein the silicon germanium region has a top surface, with a center portion of the top surface recessed lower than edge portions of the top surface to form a recess. The edge portions are on opposite sides of the center portion.

In accordance with an embodiment, a method includes forming a first gate stack over a semiconductor substrate and forming a first opening extending into the semiconductor substrate. The first opening is on a side of and adjacent to the first gate stack. The method further includes performing an epitaxy to grow a first semiconductor region in the first opening. The first semiconductor region comprises a different material than the semiconductor substrate. The first semiconductor region includes a first top surface extending above an interface between the first gate stack and the semiconductor substrate. Performing the epitaxy includes controlling epitaxy parameters so that a center portion of the first top surface is recessed lower than first and second portions of the first top surface to form a recess. The first and second portions are on opposite sides of the center portion.

In accordance with an embodiment, a method includes forming a first gate stack over a semiconductor substrate, patterning a first opening extending into the semiconductor substrate and adjacent to the first gate stack, and epitaxially growing a first semiconductor region in the first opening and comprising a different material than the semiconductor substrate. The first silicon germanium region includes a first top surface extending above an interface between the first gate stack and the semiconductor substrate, and the first top surface includes a first center portion recessed from a first portion of the first top surface. The method further includes forming a second gate stack over the semiconductor substrate, patterning a second opening extending into the semiconductor substrate and adjacent to the second gate stack, and epitaxially growing a second semiconductor region in the second opening and comprising a different material than the semiconductor substrate. The second semiconductor region includes a second top surface extending above an interface between the second gate stack and the semiconductor substrate, and the second top surface has a different profile than the first top surface.

In accordance with an embodiment, a method includes patterning a first opening and a second opening extending into a semiconductor substrate and epitaxially growing a first silicon germanium region in the first opening. The first silicon germanium region includes a first top surface, and the first top surface includes a first center portion recessed from and disposed between a first portion of the first top surface and a second portion of the first top surface. The method further includes while epitaxially growing the first silicon germanium region epitaxially growing a second silicon germanium region in the second opening. The second silicon germanium region includes a second top surface, and a center portion of the second top surface is higher than an edge portion of the second top surface.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a semiconductor substrate;
    a first gate stack over the semiconductor substrate;
    a first silicon germanium region extending into the semiconductor substrate and adjacent to the first gate stack, wherein the first silicon germanium region comprises a first top surface, with a center point of the first top surface is lower than edge points of the first top surface;
    a second gate stack over the semiconductor substrate; and
    a second silicon germanium region adjacent the second gate stack, wherein the second silicon germanium region comprises a second top surface having a different profile than the first top surface.

2. The integrated circuit structure of claim 1, wherein the first gate stack is disposed in a first region of the integrated circuit structure, wherein the second gate stack is disposed in a second region of the integrated circuit structure, and wherein a pitch of gate stacks in the first region is smaller than a pitch of gate stacks in the second region.

3. The integrated circuit structure of claim 1 further comprising a first semiconductor cap over and contacting the first top surface of the first silicon germanium region, wherein the first semiconductor cap has a germanium percentage lower than a germanium percentage of the first silicon germanium region.

4. The integrated circuit structure of claim 3 further comprising a second semiconductor cap over and contacting the second top surface of the second silicon germanium region, wherein the second semiconductor cap has a germanium percentage lower than a germanium percentage of the second silicon germanium region, and wherein an interface between the first semiconductor cap and the first silicon germanium region has a different profile than an interface between the second semiconductor cap and the second silicon germanium region.

5. The integrated circuit structure of claim 1, wherein a center point of the second top surface is higher than edge points of the second top surface.

6. The integrated circuit structure of claim 1, wherein a height difference between the center point of the first top surface and a highest point of the first top surface is in the range of 1 nm to 10 nm.

7. The integrated circuit structure of claim 1, wherein the first top surface comprises:
    a first linear portion disposed at a first angle relative a line parallel to a major surface of the semiconductor substrate; and
    a second linear portion extending continuously from the center point of the first top surface to the first linear portion of the first top surface, wherein the second linear portion is disposed at a second angle relative the line parallel to the major surface of the semiconductor substrate, the second angle being different than the first angle.

8. The integrated circuit structure of claim 7, wherein the second angle is in the range of 5 degrees to 45 degrees.

9. A device comprising:
- a semiconductor substrate;
- a first transistor at a top surface of the semiconductor substrate, the first transistor comprising:
  - a first gate; and
  - a first source/drain region comprising a first semiconductor region having a first top surface extending above the top surface of the semiconductor substrate, wherein the first top surface comprises a notch disposed in a center portion of the first top surface;
- a second transistor at the top surface of the semiconductor substrate, the second transistor comprising:
  - a second gate; and
  - a second source/drain region comprising a second semiconductor region having a second top surface extending above the top surface of the semiconductor substrate, wherein a center region of the second top surface extends continuously between and is higher than edge regions of the second top surface, and wherein the center region of the second top surface is free of notches.

10. The device of claim 9 further comprising:
- a third transistor comprising a third gate, wherein no transistors are disposed between the third transistor and the first transistor; and
- a fourth transistor comprising a fourth gate, wherein no transistors are disposed between the fourth transistor and the second transistor, and wherein a distance between the first gate and the third gate is less than a distance between the second gate and the fourth gate.

11. The device of claim 9, wherein the first semiconductor region and the second semiconductor region each comprise silicon germanium.

12. The device of claim 9 further comprising:
- a third semiconductor region overlapping the first semiconductor region and having a lower germanium percentage than the first semiconductor region; and
- a fourth semiconductor region overlapping the second semiconductor region and having a lower germanium percentage than the second semiconductor region.

13. The device of claim 12 further comprising a source/drain silicide in the third semiconductor region.

14. The device of claim 12, wherein an interface between the third semiconductor region and the first semiconductor region extends lower than an interface between the first gate and the semiconductor substrate.

15. The device of claim 12, wherein an entirety of an interface between the fourth semiconductor region and the third semiconductor region is disposed above an interface between the second gate and the semiconductor substrate.

16. A device comprising:
- a substrate;
- a first semiconductor region extending into the substrate, wherein the first semiconductor region is disposed between a first gate stack and a second gate stack adjacent the first gate stack;
- a first semiconductor cap over and forming a first interface with the first semiconductor region, wherein the first semiconductor cap has a different material composition than first semiconductor region, wherein the first interface comprises a center portion lower than edge portions of the first interface;
- a second semiconductor region extending into the substrate, wherein the second semiconductor region is disposed between a third gate stack and a fourth gate stack adjacent the third gate stack, and wherein the second semiconductor region comprises a same material as the first semiconductor region; and
- a second semiconductor cap over and forming a second interface with the second semiconductor region, wherein the second semiconductor cap has a different material composition than the second semiconductor region, wherein the second interface has a different profile than the first interface.

17. The device of claim 16, wherein the first semiconductor region and the second semiconductor region each comprise silicon germanium.

18. The device of claim 16, wherein the first semiconductor cap and the second semiconductor cap each comprise substantially pure silicon.

19. The device of claim 16, wherein the first gate stack and the second gate stack are disposed closer together than the third gate stack and the second gate stack.

20. The device of claim 16, wherein the first interface extends lower than the second interface.

* * * * *